(12) United States Patent
Lee et al.

(10) Patent No.: US 6,917,158 B2
(45) Date of Patent: Jul. 12, 2005

(54) HIGH-QUALTY ALUMINUM-DOPED ZINC OXIDE LAYER AS TRANSPARENT CONDUCTIVE ELECTRODE FOR ORGANIC LIGHT-EMITTING DEVICES

(75) Inventors: Shuit-Tong Lee, Kowloon (HK); Xin Jiang, Braunschweig (DE); Chun-Sing Lee, Kowloon (HK); Fu-Lung Wong, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 10/093,940

(22) Filed: Mar. 8, 2002

(65) Prior Publication Data

US 2003/0168973 A1 Sep. 11, 2003

(51) Int. Cl.$^7$ .............................................. H05B 33/00
(52) U.S. Cl. ........................ 313/506; 313/504; 427/66
(58) Field of Search ................................. 313/506, 504, 313/503; 427/66, 64; 428/702, 432; 362/800; 204/192.26, 192.29; 252/519.51, 519.54; 345/36, 45, 76; 445/24

(56) References Cited

U.S. PATENT DOCUMENTS

| | | | |
|---|---|---|---|
| 6,274,014 B1 * | 8/2001 | Matsumoto et al. ... | 204/298.11 |
| 6,521,360 B2 * | 2/2003 | Lee et al. .................... | 428/690 |
| 6,555,284 B1 * | 4/2003 | Boroson et al. ............ | 430/201 |
| 6,645,843 B2 * | 11/2003 | Kim et al. .................. | 438/608 |
| 2002/0098668 A1 * | 7/2002 | Kim et al. .................. | 438/584 |
| 2003/0066950 A1 * | 4/2003 | Halls et al. .............. | 250/214.1 |

OTHER PUBLICATIONS

Tang, C.W. and VanSlyke, S.A., "Organic electroluminescent diodes," *Appl. Phys. Lett.*, 51:913–915 (1987).

* cited by examiner

*Primary Examiner*—Vip Patel
*Assistant Examiner*—Glenn D. Zimmerman
(74) *Attorney, Agent, or Firm*—Heslin Rothenberg Farley & Mesiti, P.C.

(57) ABSTRACT

An organic light-emitting diode is described in which the anode comprises midfrequency magnetron sputtered aluminum-doped zinc oxide to increase the device stability and to decrease the material cost. Due to the novel deposition technique, ZnO:Al film with ITO-like electrical conductivity can be deposited and improved device performance, especially the long-term stability can be obtained which are attributed to the modification of the ZnO:Al conductivity and surface chemistry.

9 Claims, 5 Drawing Sheets

HIGH-QUALTY ALUMINUM-DOPED ZINC OXIDE LAYER AS TRANSPARENT CONDUCTIVE ELECTRODE FOR ORGANIC LIGHT-EMITTING DEVICES

FIELD OF THE INVENTION

The present invention relates to of organic and polymer light-emitting devices (OLEDs and PLEDs). More specifically, this invention relates to the use of a novel class of Al-doped zinc oxide transparent electrode materials for producing efficient organic and polymer light-emitting devices, and to such devices formed thereby.

BACKGROUND OF THE INVENTION

Since Tang and Vanslyke made the first multi-layer organic light-emitting diode by vacuum deposition of organic thin films at room temperature (Appl. Phys. Lett. 51, 913 (1987)), OLEDs as well as PLEDs have received considerable attention due to their potential applications in flat-panel display. As a result, more and more new materials and processing technologies have been developed to improve the performance of the devices. The main attention was paid to developing large-area flat panel displays with high contrast, high brightness, long-term stability, and low production cost.

To obtain high-performance light emitting devices with low carrier injection barriers, high electroluminescence (EL) efficiency and long lifetime, materials design and device configurations are two important factors. It is desirable that the materials possess the following properties: good carrier transport properties, high photoluminescence (PL) quantum yield, and suitable ionization potential (IP) and/or electron affinity (EA). Thus, the synthesis of highly fluorescent and stable materials that can be utilized in organic and polymer LEDs is one of the most challenging tasks in this field.

To all these aspects, electrodes are regarded as a most important component for the performance of the devices. In a basic organic and polymer LED structure, transparent conductive oxide (TCO) layer is used as the anode. A widely used TCO is tin-doped indium oxide (ITO) due to its high conductivity, work function and transparency over visible spectral range. Although ITO is probably the most successful TCO, indium is a relatively scarce element in the earth's crust. The estimated reserves are only 2600 metric tones and the current rate of extraction is approximately 230 metric tones annually. The cost for ITO production is therefore high. The other drawback of ITO films is the low chemical stability in a reduced ambient. The indium in the ITO layer can diffuse into the organic materials, leading to a degradation of the LED device performance.

In order to achieve the best device performance and to reduce the cost of device production, it is necessary to seek new electrode materials. In the present invention the mid-frequency magnetron sputter deposited aluminum-doped zinc oxide (ZnO:Al) films are used as anode material for preparing LED devices. These films deposited at a temperature lower than 200 C. with a high deposition rate of about 10 nm/s exhibit low resistivity of 300 $\mu\Omega$cm. Furthermore, they are more stable in reducing ambient than ITO material.

SUMMARY OF THE INVENTION

It is an object of the present invention to provide organic and polymer LEDs in which the anode is a mid-frequency-sputtered ZnO:Al layer which can have comparable film conductivity and surface work function to ITO layers and which is capable of producing long-term stable, high performance LEDs. The above objective is achieved in an organic EL device, comprising an anode, cathode, and at least one organic luminescent layer.

According to the present invention therefore, there is provided an organic or polymer light emitting diode, comprising: (a) a substrate formed of an electrically insulating material which can be either an optically transparent material or an opaque material; (b) a conductive anode of aluminum-doped zinc oxide formed over the substrate; (c) an organic or polymer light-emitting structure formed over the anode; and (d) a cathode formed over the organic light-emitting structure.

According to another aspect of the present invention there is further provided a method of making an organic light-emitting diode, comprising the steps of: (a) providing a substrate; (b) depositing as an anode aluminum-doped zinc-oxide film over the substrate by midfrequency magnetron sputtering operated at 40 kHz; (c) forming an organic light-emitting structure over the anode, and (d) depositing a cathode layer over the organic light-emitting structure.

BRIEF DESCRIPTION OF THE DRAWINGS

An embodiment of the invention will now be described by way of example and with reference to the accompanying drawings, in which.

DETAILED DESCRIPTION OF THE PREFERRED EMBODIMENTS

Figure 1:
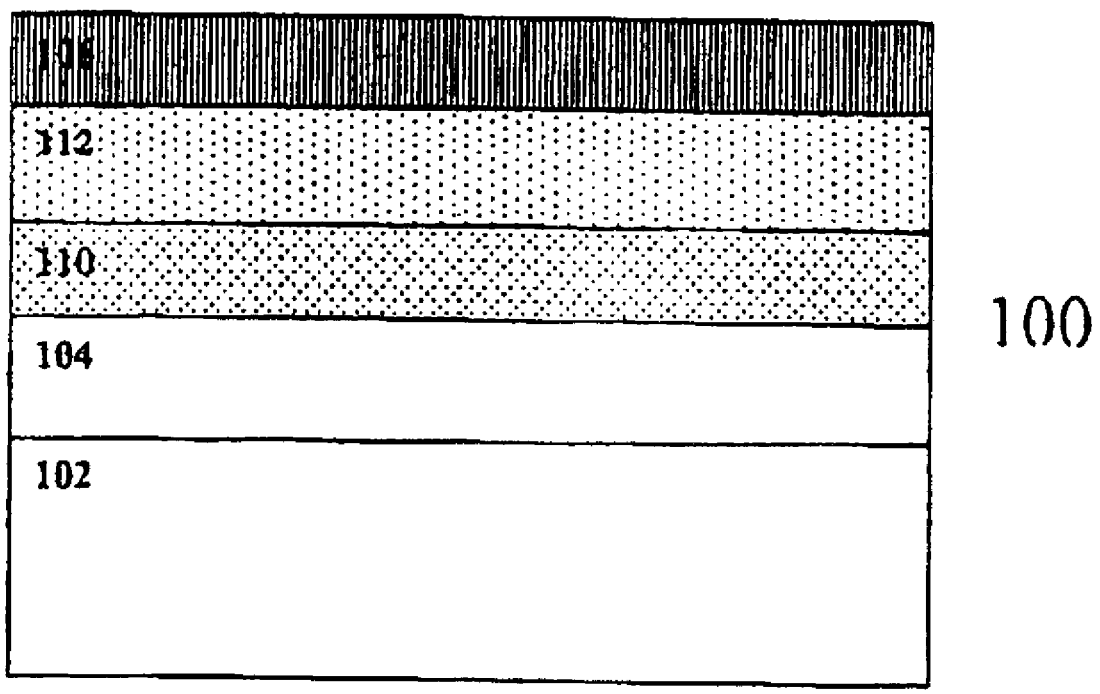
FIG. 1 is a schematic diagram of the multi-layer structure of a preferred EL device in accordance with an embodiment of the present invention.
Figure 2:
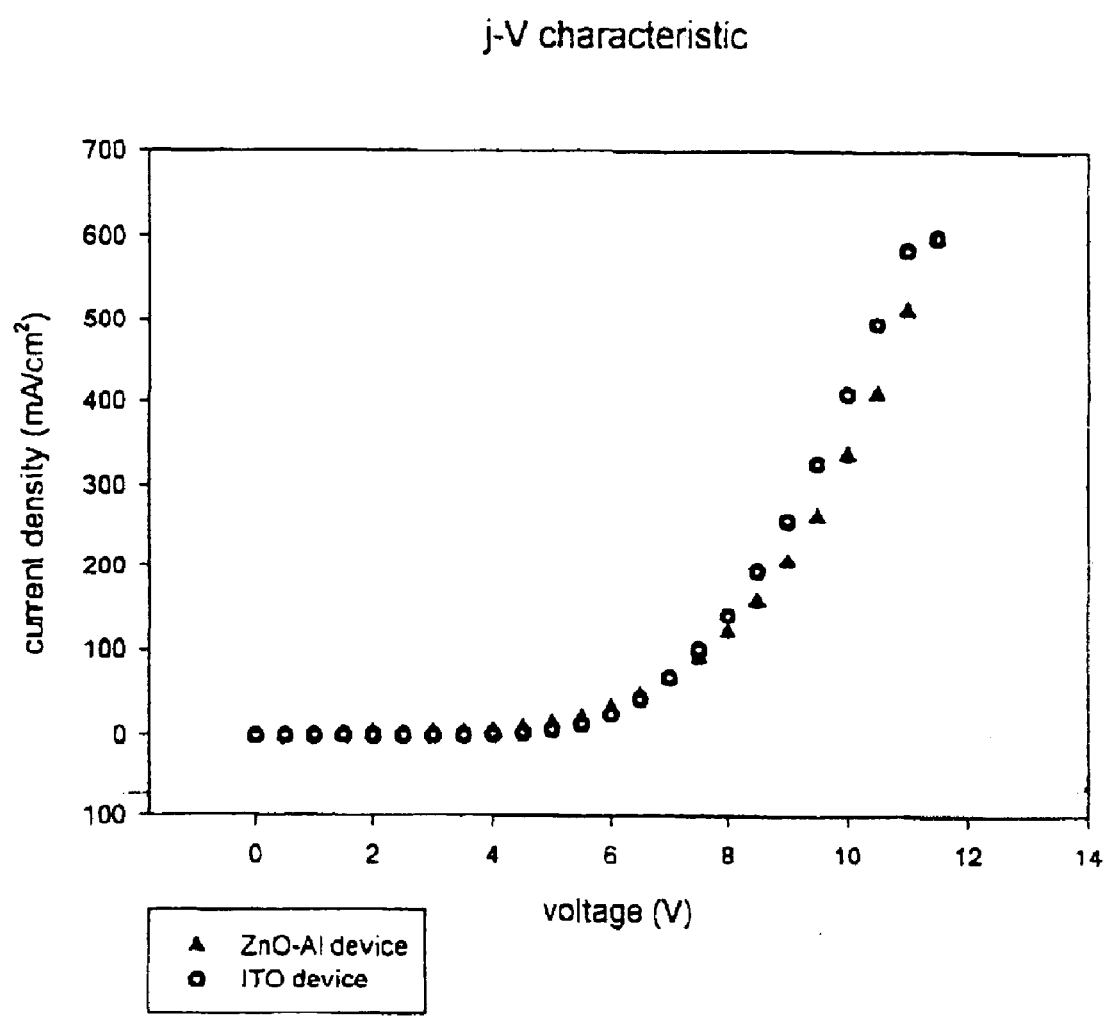
FIG. 2 is a plot showing the luminance-current-voltage characteristics of an organic LED according to FIG. 1, FIG. 3. is a plot showing the luminance-brightness-voltage characteristics of the organic LED of FIG. 1.
Figure 3:
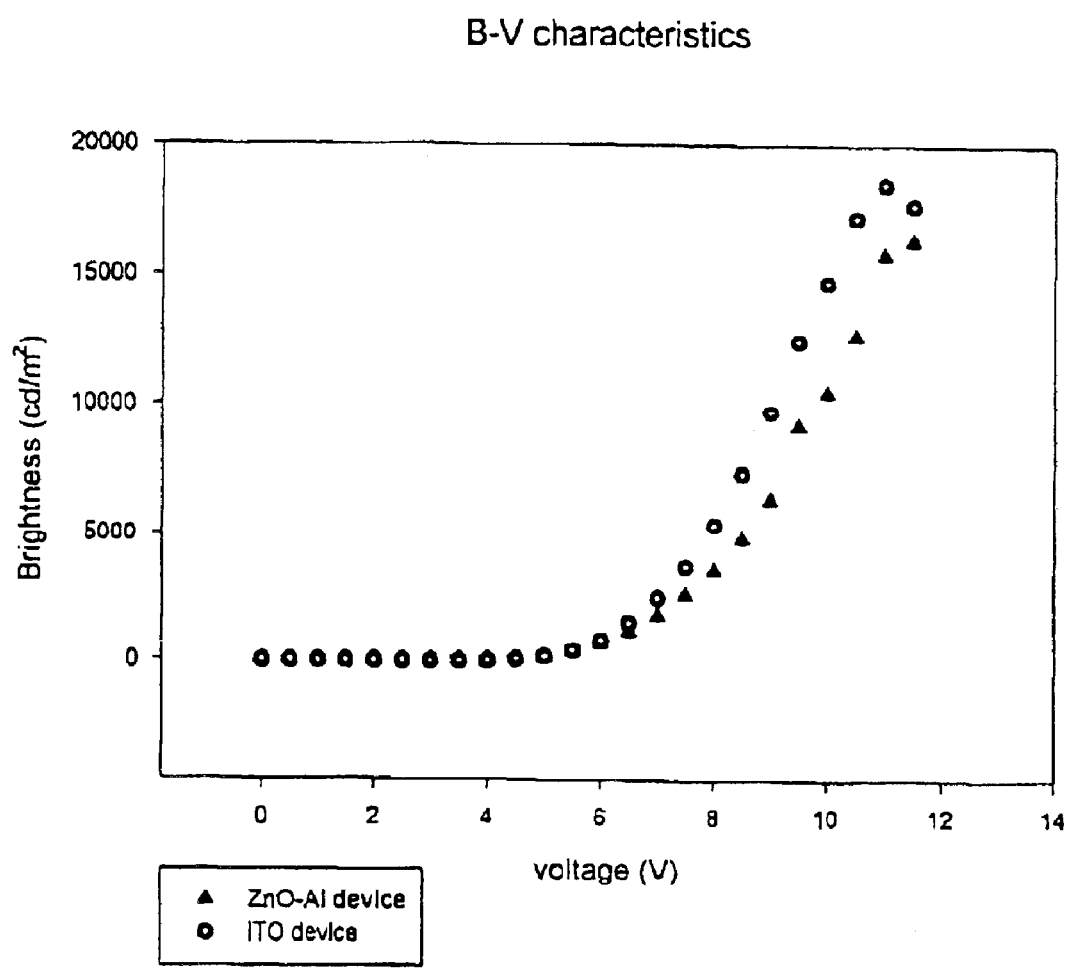
Figure 4:
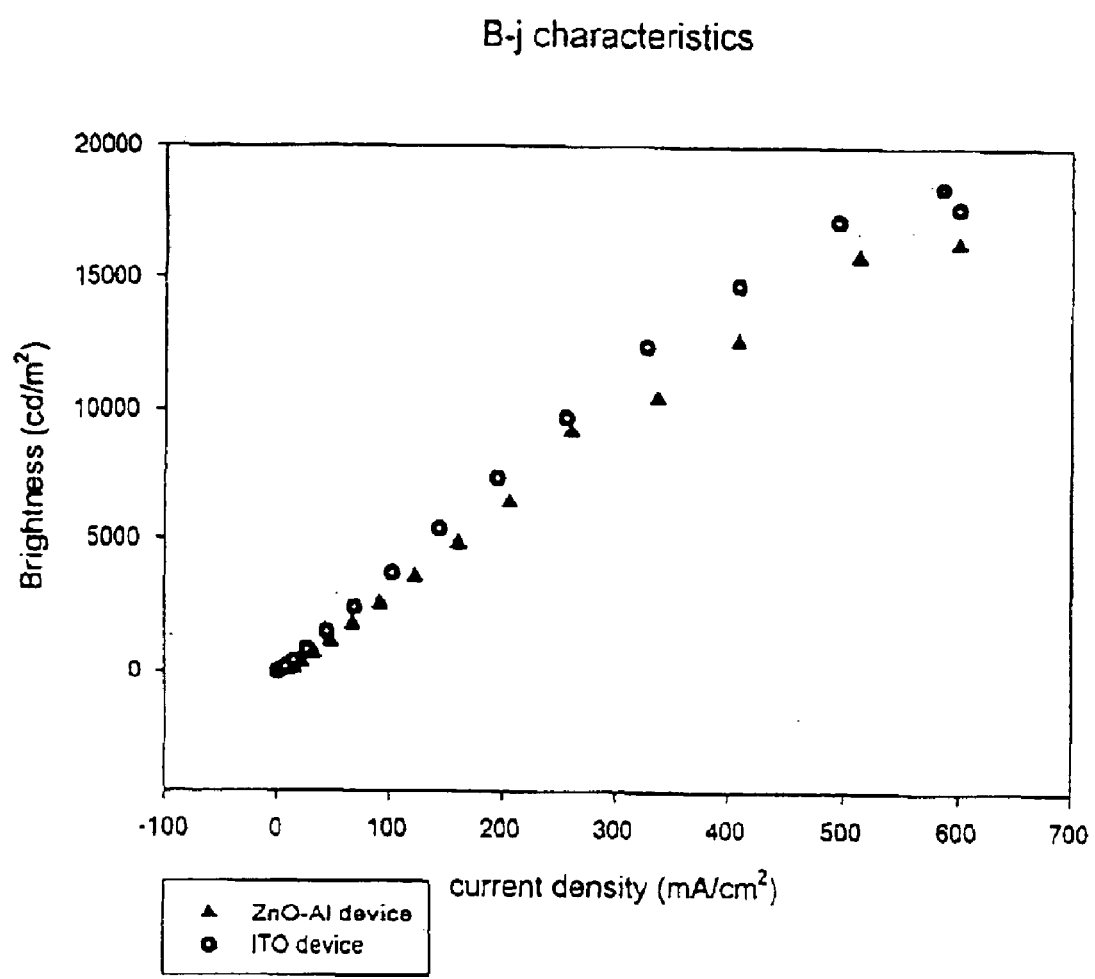
FIG. 4 is a plot showing the luminance-brightness-current characteristics of the organic LED of FIG. 1.
Figure 5:
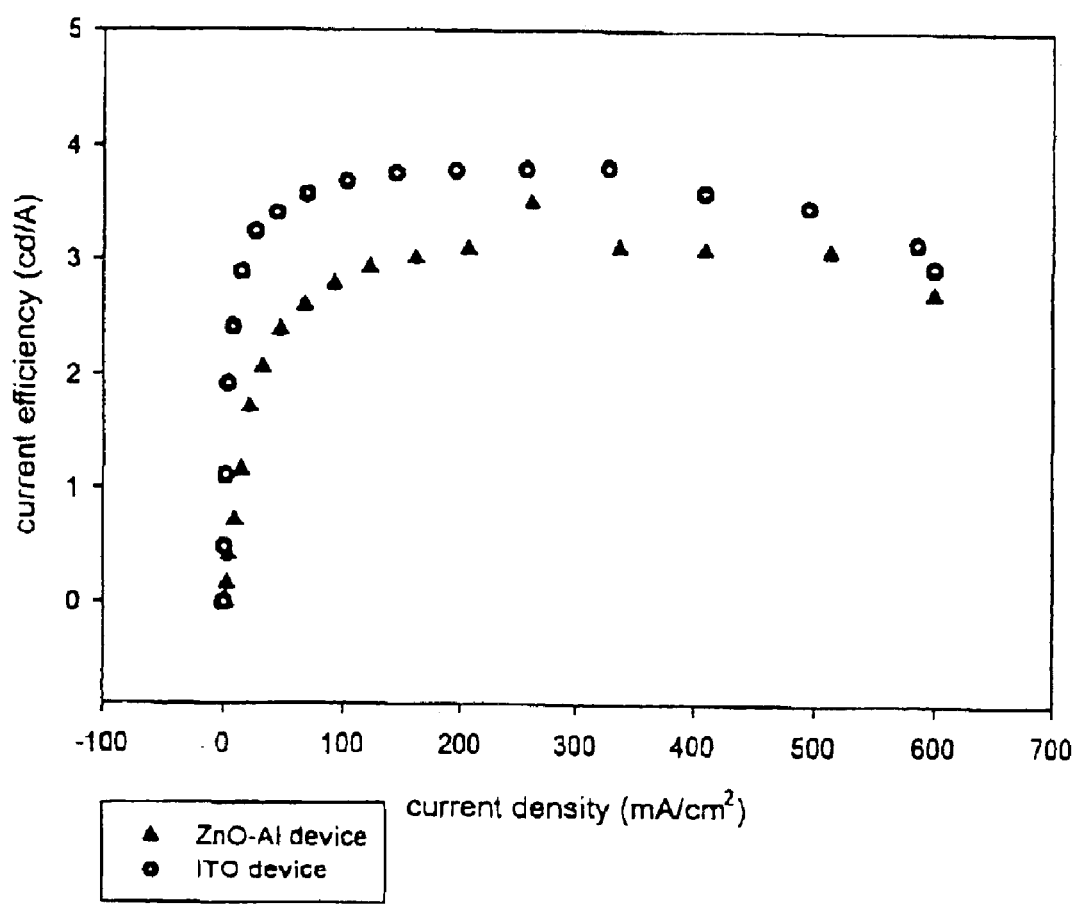
FIG. 5 is a plot showing the luminance-current-efficiency characteristics of the organic LED.

An EL device 100 according to the invention is schematically illustrated in FIG. 1. The support is layer 102, which is an electrically insulating and optically transparent material such as glass or plastic. Anode 104 is a midfrequency magnetron sputtered ZnO:Al layer separated from cathode 106 by an organic EL medium, which, as shown, consists of two superimposed layers of organic thin films. Layer 110 located on the anode forms a hole-transport layer of the organic EL medium. Located above the hole-transport layer is layer 112, which forms an light emitting layer as well as an electron-transport layer of the organic EL medium.

When the anode is at a higher potential than the cathode, holes (positive charge carriers) are injected from the anode into the hole-transport layer, and electrons are injected into the electron-transport layer. The injected holes and electrons each migrate toward the oppositely charged electrode. This results in hole-electron recombination and a release of energy in part as light, thus producing electroluminescence.

The substrate for the EL devices 100 is electrically insulating and light transparent. The anode 104 is formed of a conductive and transparent layer (TCO). The light transparent property of the substrate 102 and the TCO layer 104 is desirable for viewing the EL emission through the substrate. For applications where the EL emission is viewed through the top electrode, the transmissive characteristic of the support is immaterial, and therefore any appropriate substrate such as opaque semiconductor and ceramic wafers can be used. Of course, it is necessary to provide in these device configurations a light transparent top electrode. The anode layer must have a work function greater than 4.1 eV.

For ZnO:Al film anode preparation midfrequency magnetron sputtering system operating at 40 kHz was used. Argon and oxygen were the process gas and reactive gas, respectively. As the target, metallic zinc with aluminum content of 2 at % was applied. As used herein, the term "at %" means "atomic percent." To obtain films with variable properties the oxygen partial pressure, plasma power density and the substrate temperature are optimized. Films were deposited at fixed target to substrate distance of 80 mm and at constant Argon pressure of 0.15 Pa. The base pressure was lower than $3\times10^6$ mbar for all depositions. Due to its high ion flux and ion energy, and the effective activation of plasma species good film properties can be obtained at deposition rate of approximately 10 nm/s and substrate temperature lower than 200° C. The prepared films have strongly improved film properties. The film resistivity is as low as 1%. These films exhibit carrier density above $8\times10^{20}$ cm$^{-3}$ and optical band gap of 3.9 eV. The important parameter for the LEDs, surface work function, is higher than 4.3 eV. Typically, the deposited aluminum-doped zinc oxide film has a composition comprising: zinc in a range of 30–70 at %; oxygen in a range of 70–30 at %; and aluminum in a range of 0–10 at %.

At end of film deposition the $O_2$ partial pressure and the substrate temperature was reduced to prepare a film surface at metallic sputtering mode. The Zn:O ratio is larger than 1.0 and a high surface work function (>4.3 eV, UPS measurement) of the film can be obtained. Prior to the evaporation of the organic layer the coated glass substrate was treated with ultraviolet ozone (UVO) cleaner for 25 min.

The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine.

The luminescent layer of the organic EL device comprises a luminescent or fluorescent material, where electroluminescence is produced as a result of electron-hole pair recombination in this region. In the simplest construction, the luminescent layer comprises a single component, which is a pure material with a high fluorescent efficiency. Particularly preferred thin film forming materials for use in forming the luminescent layers of the organic light-emitting device 100 are metal chelated oxinoid compounds, including chelates of oxine itself (also commonly referred to as 8-quinolinol or 8-hydroxyquinoline). Such compounds exhibit high levels of performance and are readily fabricated in the form of thin films.

From the foregoing it is apparent that the metal can be monovalent, divalent, or trivalent metal. The metal can, for example, be an alkali metal, such as lithium, sodium, or potassium; an alkaline earth metal, such as magnesium or calcium; or a regular metal, such as boron or aluminum. Generally any monovalent, divalent, or trivalent metal known to be a useful chelating metal can be employed. A well-known material is tris(8-quinolinato) aluminum, (Alq), which produces excellent green electroluminesence.

A preferred embodiment of the luminescent layer comprises a multi-component material consisting of a host material doped with one or more components of fluorescent dyes. Using this method, highly efficient EL devices can be constructed. Simultaneously, the color of the EL devices can be tuned by using fluorescent dyes of different emission wavelengths in a common host material. An important relationship for choosing a fluorescent dye as a dopant capable of modifying the hue of light emission when present in a host material is a comparison of their bandgap energy, which is defined as the energy difference between the highest occupied molecular orbital and the lowest unoccupied molecular orbital of the molecule. For efficient energy transfer from the host to the dopant molecule, a necessary condition is that the bandgap of the dopant is smaller than that of the host material.

In the practice of the present invention, the host material forming the EL luminescent layer where light is emitted in response to electron-hole recombination is aluminum trisoxine (Alq3). Efficient blue electroluminescent materials can also be used as a host because their band gap is substantially greater than that of the dopant materials disclosed in this invention.

The organic EL devices of this invention can employ a cathode constructed of any metal having a work function lower than 4.0 eV, such as calcium and lithium. The cathode can also be formed through alloying a low work function metal with a high work function metal. A bilayer structure of Al/LiF can also be used to enhance electron injection, as disclosed in U.S. Pat. No. 5,624,604 by Hung et al.

In the present invention, it has been found that a aluminum-doped zinc oxide anode layer is capable of producing highly efficient OLEDs as well as polymer LEDs, and the prepared devices have a long-term stability in comparison with the commercial ITO layer.

The preferred materials for the multi-layers of the organic EL medium are each capable of film-forming; that is, capable of being fabricated as a continuous layer having a thickness of less than 5000 Å. A preferred method for forming the organic EL medium is by vacuum vapor deposition. Extremely thin defect-free continuous layers can be formed by this method. Specifically, the individual layer thickness as low as about 50 Å can be constructed while still realizing satisfactory EL device performance. It is generally preferred that the overall thickness of the organic EL medium be at least about 1000 Å.

Other methods for forming thin films in EL devices of this invention include spin-coating from a solution containing the EL material. A combination of spin-coating method and vacuum vapor deposition method is also useful for the fabrication of multi-layer EL devices.

EXAMPLE

The invention and its advantages are further illustrated by the specific example as follows:
Device Preparation and Characterization

EXAMPLE (Glass/ZnO-AL/NPB(700 Å)/Alq(550 Å)/MgAg (1500 Å))

An EL device satisfying the requirements of the invention was constructed in the following manner.

a) A patterned aluminum-doped zinc oxide (ZnO:Al, sheet resistance of ZnO-Al=7.5Ω/) coated glass substrate was sequentially ultrasonicated in a commercial detergent, rinsed in deionized water, degreased in toluene vapor, dried in oven for overnight and treated with ultraviolet ozone (UVO) cleaner for 25 min.

b) Onto the ZnO:Al anode a hole transport layer (700 Angstroms) of α-napthylphenylbiphenyl (NPB) was then deposited in an ultra high vacuum (UHV) by evaporation from a tantalum boat.

c) A luminescent layer which is also used as an electron-transport layer of Alq (550 Angstroms) was then deposited onto the hole transport layer by evaporation from a tantalum boat.

d) On top of the Alq layer a cathode layer (1500 Angstroms) formed of a 10:1 atomic ratio of Mg and Ag was deposited by evaporation.

Control Device for Comparison(Glass/ITO/NPB(700 Å)/Alq(550 Å)/MgAg(1500 Å))

An EL device according to the prior art was constructed in the following manner for the sake of comparison.

a) An patterned indium-tin-oxide (ITO, sheet resistance of ITO=10Ω/) coated glass substrate was sequentially ultra-sonicated in a commercial detergent, rinsed in deionized water, degreased in toluene vapor, dried in oven for overnight and treated with ultraviolet ozone (UVO) cleaner for 25 min.

b) Onto the ITO anode a hole transport layer (700 Angstroms) of α-napthylphenylbiphenyl (NPB) was then deposited in an ultra high vacuum (UHV) by evaporation from a tantalum boat.

c) A luminescent layer which is also used as an electron-transport layer of Alq (550 Angstroms) was then deposited onto the hole transport layer by evaporation from a tantalum boat.

d) On top of the Alq layer a cathode layer (1500 Angstroms) formed of a 10:1 atomic ratio of Mg and Ag was deposited by evaporation.

The devices with the configuration of NPB(700 Å)/Alq (550 Å)/MgAg(2000 Å) was prepared under the base pressure maintained at lower than $9 \times 10^{-7}$ Torr. The deposition rate of NPB and Alq were maintained at 1 Å/s while the % wt of MgAg was maintained at 10:1. After finished the deposition, the devices were kept in the same vacuum for cooling for 15 minutes. The devices were then taken out to have heat treatment, EL performance evaluation and dark spot growth investigation. Each light emitting area dot has an area of 0.1 cm$^2$.

The current-voltage-brightness (I-V-B) characteristic was measured by a Spectracan PR650 spectrophotometer and a computer-controlled direct-current power supply at room temperature. The dark spot growth was analysis by a LEICA fluorescence microscope. Each device was arranged to have (I-V-B). The results of the measurements are shown in FIGS. 2–5.

The light output from the devices using ZnO:Al and ITO anodes had similar turn on voltages of 3.2 V and 3.3 V, and luminance efficiencies of 3.0 cd/A and 3.8 cd/A, respectively. The long-term stability tests of the encapsulated devices show an improved result for ZnO:Al device in comparison to the ITO device.

What is claimed is:

1. An electroluminescent device comprising an organic or polymer-light emitting diode comprising:
    a) a substrate formed of an electrically insulating material chosen from an optically transparent material and an opaque material;
    b) a conductive anode comprised of aluminum-doped zinc oxide films formed over the substrate by a magnetron sputtering process, wherein the surface of the aluminum-doped zinc oxide films is chemically modified at the end of the deposition process by reducing the oxygen partial pressure and the substrate temperature to provide an atomic ratio of Zn:O greater than 1 and a ZnO:Al surface work function greater than 4.3 eV, and wherein the conductive anode exhibits a carrier density greater than $8 \times 10^{20}$ cm$^{-3}$;
    c) an organic or polymer light-emitting structure formed over the conductive anode; and
    d) a cathode formed over the light-emitting structure.

2. The electroluminescent device according to claim 1, wherein the substrate is an optically transparent material chosen from glass and plastic.

3. The electroluminescent device according to claim 1, wherein the substrate is an opaque material chosen from a ceramic or semi-conducting material.

4. The electroluminescent device according to claim 1, wherein the aluminum-doped zinc oxide is deposited by a midfrequency magnetron sputtering process.

5. The electroluminescent device according to claim 1, wherein the aluminum-doped zinc oxide is a composition having an atomic ratio of Zn:O greater than 1, said composition comprising:
    a) zinc in a range of 30–70 atomic percent;
    b) oxygen in a range of 70–30 atomic percent; and
    c) aluminum in a range of 10 atomic percent or less.

6. The electroluminescent device according to claim 2, wherein the aluminum-doped zinc oxide is a composition having an atomic ratio of Zn:O greater than 1, said composition comprising:
    a) zinc in a range of 30–70 atomic percent;
    b) oxygen in a range of 70–30 atomic percent; and
    c) aluminum in a range of 10 atomic percent or less.

7. The electroluminescent device according to claim 3, wherein the aluminum-doped zinc oxide is a composition having an atomic ratio of Zn:O greater than 1, said composition comprising:
    a) zinc in a range of 30–70 atomic percent;
    b) oxygen in a range of 70–30 atomic percent; and
    c) aluminum in a range of 10 atomic percent or less.

8. The electroluminescent device according to claim 4, wherein the aluminum-doped zinc oxide is a composition having an atomic ratio of Zn:O greater than 1, said composition comprising:
    a) zinc in a range of 30–70 atomic percent;
    b) oxygen in a range of 70–30 atomic percent; and
    c) aluminum in a range of 10 atomic percent or less.

9. A method of making an organic light-emitting diode comprising the steps of:
    a) providing a substrate;
    b) forming an anode on the substrate, the anode comprised of aluminum-doped zinc oxide films deposited by magnetron sputtering at a temperature lower than 200° C., wherein the surface of the aluminum-doped zinc oxide films is chemically modified at the end of the deposition process by reducing the oxygen partial pressure and the substrate temperature to provide an atomic ratio of Zn:O greater than 1 and a ZnO:Al surface work function greater than 4.3 eV, and wherein the conductive anode exhibits a carrier density greater than $8 \times 10^{20}$ cm$^{31\ 3}$;
    c) forming an organic or polymer light-emitting structure over the anode; and
    d) depositing a cathode layer over the light-emitting structure.

* * * * *

UNITED STATES PATENT AND TRADEMARK OFFICE
CERTIFICATE OF CORRECTION

PATENT NO.    : 6,917,158 B2  
DATED         : July 12, 2005  
INVENTOR(S)   : Lee et al.

Page 1 of 1

It is certified that error appears in the above-identified patent and that said Letters Patent is hereby corrected as shown below:

<u>Title page,</u>
Item [73], Assignee, delete "City University of Hong Kong" and insert
-- CityU Research Limited --.

Signed and Sealed this

Twenty-eighth Day of March, 2006

JON W. DUDAS
*Director of the United States Patent and Trademark Office*